United States Patent
Byun et al.

(10) Patent No.: US 7,068,084 B2
(45) Date of Patent: Jun. 27, 2006

(54) DELAY LOCKED LOOP CAPABLE OF COMPENSATING FOR DELAY OF INTERNAL CLOCK SIGNAL BY VARIATION OF DRIVING STRENGTH OF OUTPUT DRIVER IN SEMICONDUCTOR MEMORY DEVICE

(75) Inventors: Gyung-su Byun, Seoul (KR); Nak-won Heo, Suwon (KR)

(73) Assignee: Samsung Electronics, Co., Ltd. (KR)

( * ) Notice: Subject to any disclaimer, the term of this patent is extended or adjusted under 35 U.S.C. 154(b) by 141 days.

(21) Appl. No.: 10/702,838

(22) Filed: Nov. 6, 2003

(65) Prior Publication Data
US 2004/0124896 A1 Jul. 1, 2004

(30) Foreign Application Priority Data
Dec. 28, 2002 (KR) .................. 10-2002-0085867

(51) Int. Cl.
*H03L 7/06* (2006.01)

(52) U.S. Cl. ................. 327/158; 327/159; 327/161

(58) Field of Classification Search .............. 327/161, 327/141, 146, 147, 149, 154–159, 292, 294, 327/299; 331/17, 25, 34, 1 A
See application file for complete search history.

(56) References Cited
U.S. PATENT DOCUMENTS

| 5,973,525 | A | * | 10/1999 | Fujii | ...................... 327/158 |
|---|---|---|---|---|---|
| 6,417,715 | B1 | * | 7/2002 | Hamamoto et al. | .......... 327/291 |
| 6,476,653 | B1 | | 11/2002 | Matsuzaki | ................... 327/158 |
| 6,493,829 | B1 | * | 12/2002 | Kubo | ........................... 713/500 |
| 6,509,776 | B1 | * | 1/2003 | Kobayashi et al. | .......... 327/277 |
| 6,720,807 | B1 | * | 4/2004 | Kubo et al. | .................. 327/141 |

FOREIGN PATENT DOCUMENTS

| JP | 2000-59210 | 2/2000 |
|---|---|---|
| KR | 2002-0059229 | 7/2002 |

* cited by examiner

*Primary Examiner*—Terry D. Cunningham
*Assistant Examiner*—An T. Luu
(74) *Attorney, Agent, or Firm*—Mills & Onello LLP

(57) ABSTRACT

In a delay locked loop (DLL) of a semiconductor memory device capable of compensating for delay of an internal clock signal by variation of driving strength of an output driver, a replica output driver exhibits the same delay amount as the delay amount as an output driver whose driving strength varies. A phase detector detects a phase difference between an internal clock signal which is delayed by the replica output driver, and an external clock signal. A control circuit generates a control signal in response to the output signal of the phase detector. A variable delay circuit, in response to the control signal, delays the external clock signal and generates the internal clock signal in synchronization with the external clock signal. Since the DLL has a replica output driver which can accurately track the delay of an internal clock signal by variation of the driving strength of an output driver in the feedback loop, output data can be accurately synchronized with an external clock signal.

7 Claims, 2 Drawing Sheets

DELAY LOCKED LOOP CAPABLE OF COMPENSATING FOR DELAY OF INTERNAL CLOCK SIGNAL BY VARIATION OF DRIVING STRENGTH OF OUTPUT DRIVER IN SEMICONDUCTOR MEMORY DEVICE

This application claims priority from Korean Patent Application No. 02-85867, filed on Dec. 28, 2002, the disclosure of which is incorporated herein in its entirety by reference.

BACKGROUND OF THE INVENTION

1. Field of the Invention

The present invention relates to a semiconductor memory device, and more particularly, to a delay locked loop circuit (hereinafter referred to as 'DLL') of a semiconductor memory device.

2. Description of the Related Art

Generally, in a double data rate synchronous DRAM (DDR SDRAM, hereinafter referred to as a synchronous semiconductor memory device), data read and write operations are performed by an internal clock signal that is synchronized with an external clock signal. More specifically, a read and write operation is performed every half cycle of an internal clock signal. A DLL having a delay characteristic is used for generating this internal clock signal. In order to accurately synchronize output data of a synchronous semiconductor memory device with an external clock signal, the DLL comprises a delay element requiring delay compensation in its feedback loop. For example, the delay element may comprise an output driver.

The conventional DLL comprises a variable delay circuit, a phase detector, a control circuit, and a replica output driver.

The replica output driver included in the feedback loop in the DLL replicates, or copies, the delay of an internal clock signal which is delayed through the output driver of the synchronous semiconductor memory device.

The phase detector detects the phase difference between the internal clock signal delayed through the replica output driver, and the external clock signal. The control circuit generates a control signal for controlling the delay amount of the variable delay circuit in response to the output signal of the phase detector. In response to the control signal, the variable delay circuit delays the external clock signal and generates an internal clock signal that is synchronized with the external clock signal.

Meanwhile, in response to a driver impedance control signal generated by a mode register included in the semiconductor memory device, the output driver of the synchronous semiconductor memory device can change its driving strength. As the driving strength of the output driver changes, the impedance of the output driver changes and it may cause a delay in the internal clock signal of the output driver. However, since the replica output driver included in the conventional DLL is not separately controlled by the driver impedance control signal, it cannot copy the delay of the internal clock signal with respect to the variation of impedance of the output driver. That is, the replica output driver may not accurately track the output driver. Accordingly, for this reason, the output data of the synchronous semiconductor memory device cannot be accurately synchronized with the external clock signal.

SUMMARY OF THE INVENTION

The present invention provides a delay locked loop (DLL) of a semiconductor memory device, the DLL having a replica output driver capable of accurately tracking the delay of an internal clock signal through variation of impedance of an output driver.

According to an aspect of the present invention, there is provided a delay locked loop (DLL) of a semiconductor memory device that is capable of compensating for delay of an internal clock signal by variation of driving strength of an output driver. In the DLL, a replica output driver exhibits the same delay amount as the delay amount as an output driver whose driving strength varies. A phase detector detects a phase difference between an internal clock signal which is delayed by the replica output driver, and an external clock signal. A control circuit generates a control signal in response to the output signal of the phase detector. A variable delay circuit, in response to the control signal, delays the external clock signal and generates the internal clock signal in synchronization with the external clock signal.

In the DLL, the driving strength of the output driver varies in response to a driver impedance control signal generated, for example, at a mode register of the semiconductor memory device, and in response to the driver impedance control signal, the replica output driver has the same delay amount as the delay amount of the internal clock signal generated by the output driver.

In the DLL, the replica output driver comprises: a first inverter which inverts the internal clock signal; a second inverter which inverts the output signal of the first inverter and generates an internal clock signal which is delayed through the replica output driver; a third inverter which inverts the internal clock signal; and a switch which in response to the driver impedance control signal, transfers the output signal of the third inverter to a node placed between the output terminal of the first inverter and the input terminal of the second inverter.

Since the DLL of a semiconductor memory device according to the present invention has a replica output driver which can accurately track the delay of an internal clock signal by variation of the driving strength of an output driver in the feedback loop, output data can be accurately synchronized with an external clock signal.

BRIEF DESCRIPTION OF THE DRAWINGS

The above objects and advantages of the present invention will become more apparent by describing in detail exemplary embodiments thereof with reference to the attached drawings in which.

DETAILED DESCRIPTION OF PREFERRED EMBODIMENTS

Figure 1:
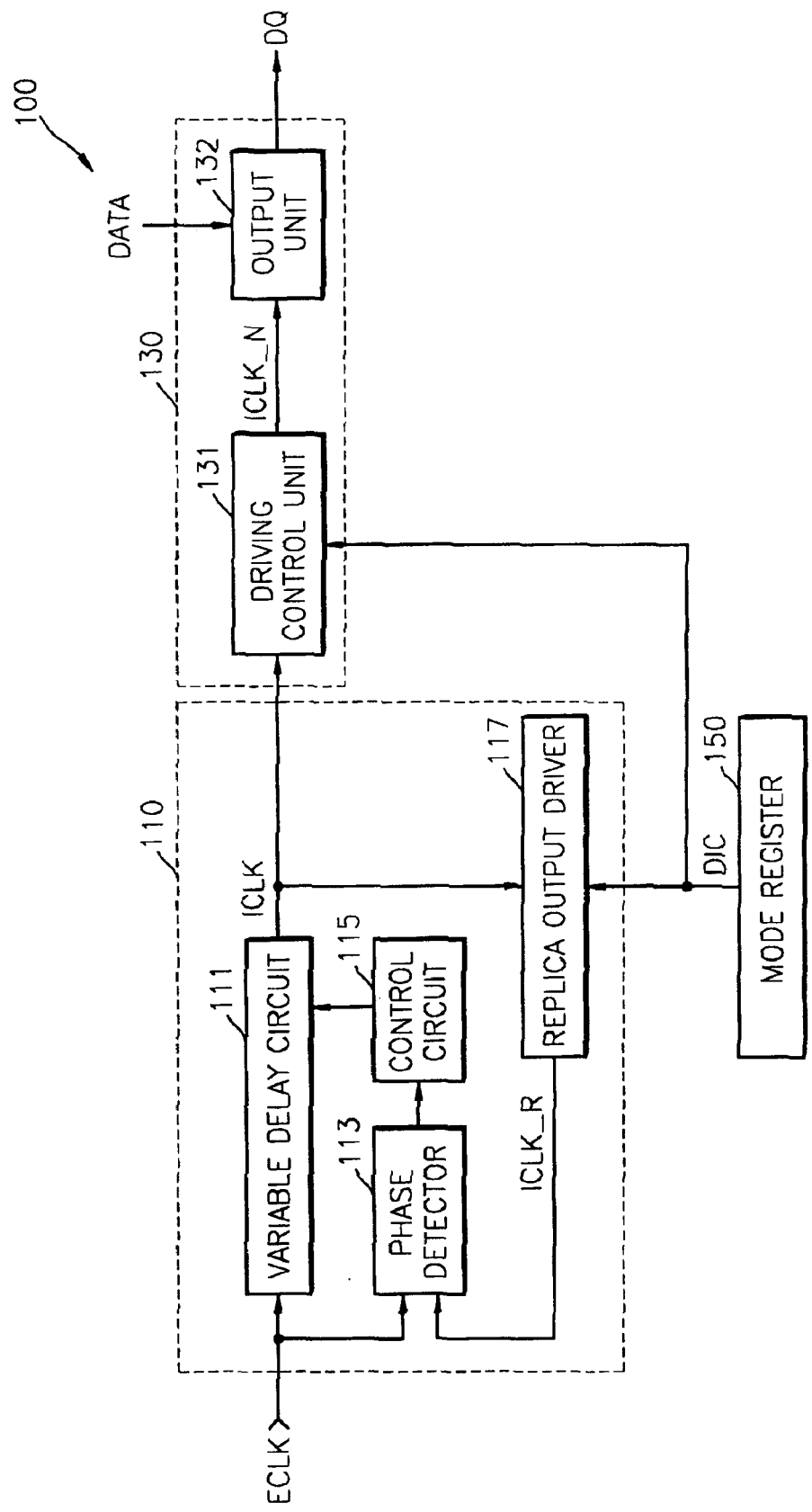
FIG. 1 is a schematic block diagram of a semiconductor memory device having a DLL according to a preferred embodiment of the present invention.

Referring to FIG. 1, the semiconductor memory device 100 comprises a DLL 110, an output driver 130, and a mode register 150. More specifically, the DLL 110 comprises a variable delay circuit 111, a phase detector 113, a control circuit 115, and a replica output driver 117.

The output driver 130 comprises a driving control unit 131 and an output unit 132. In response to a driver impedance control signal (DIC) generated by the mode register 150, the driving control unit 131 converts an internal clock signal (ICLK) into an internal clock signal (ICLK_N) for controlling the driving strength of the output unit 132. The output unit synchronizes data (DATA) output from a memory cell (not shown) of the semiconductor memory device 100, with the internal clock signal (ICLK_N) and outputs the data to a data pin (DQ). That is, the internal clock signal (ICLK_N) changes the driving strength of the output driver 130. As the driving strength of the output driver 130 changes, the impedance of the output driver 130 varies, which causes variable delay in the internal clock signal (ICLK) in the output driver 130.

In response to the driver impedance control signal (DIC), the replica output driver 117 delays the internal clock signal (ICLK) an amount that is the same as the delay amount of the internal clock signal generated by the output driver 130, and generates a delayed internal clock signal (ICLK_R). That is, since the driver impedance control signal (DIC) controlling the driving strength of the output driver 130 is also provided to the replica output driver 117 and, therefore, the amount of delay of the internal clock signal ICLK_R is controlled, the replica output driver 117 can accurately track the delay of the internal clock signal by the variation of the driving strength of the output driver 130.

The operation of the DLL 110 will now be explained. The phase detector 113 detects the phase difference between the internal clock signal (ICLK_R) which is delayed by the replica output driver 117, and the external clock signal (ECLK). The control circuit 115 generates a control signal in response to the output signal of the phase detector 115. The variable delay circuit 111 delays the external clock signal (ECLK) in response to the control signal and generates an internal clock signal (ICLK) that is synchronized with the external clock signal (ECLK). Accordingly, though the driving strength of the output driver 130 changes, data which is output from the output driver 130 to the data pin (DQ) can be accurately synchronized with the external clock signal (ECLK).

Figure 2:
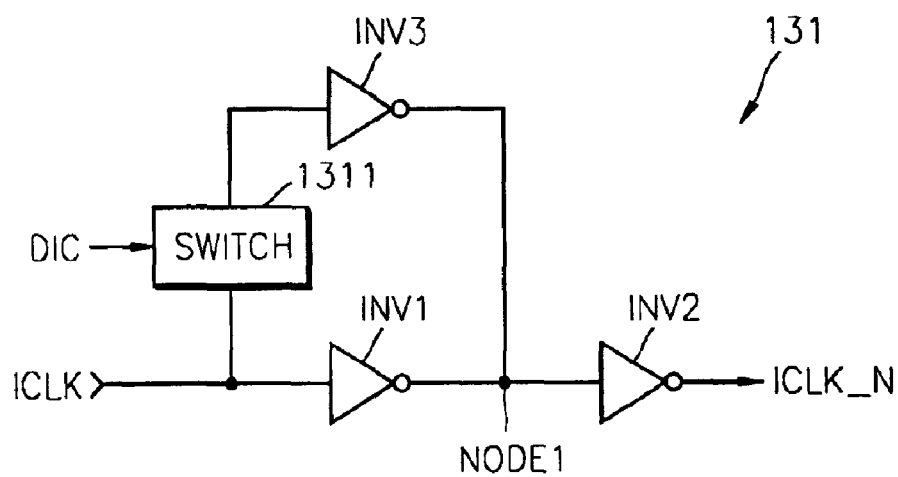
FIG. 2 is a detailed diagram of the driving control unit of FIG. 1.

FIG. 2 is a detailed diagram of an example of the driving control unit of FIG. 1. Referring to FIG. 2, the driving control unit 131 comprises inverters (INV1~INV3) and a switch 1311.

The inverters (INV1, INV2) buffer the internal clock signal (ICLK) and generates the delayed internal clock signal (ICLK_N). The switch 1311 is turned on/off in response to the driver impedance control signal (DIC).

If the driver impedance control signal (DIC) is activated and the switch 1311 is turned on, the inverter (INV3) transfers a signal obtained by inverting the internal clock signal (ICLK), to a node (NODE1). The signal transferred to the node (NODE1) increases the driving strength of a buffer formed by the inverters (INV1, INV2).

Meanwhile, though the number of driving strength increment circuit, which increases the driving strength of the buffer, that is formed by the inverter (INV3) and the switch 1311, is one in FIG. 2, other embodiments of the driving control unit 131 may comprise, for example, two, or more, driving strength increment circuits.

Figure 3:
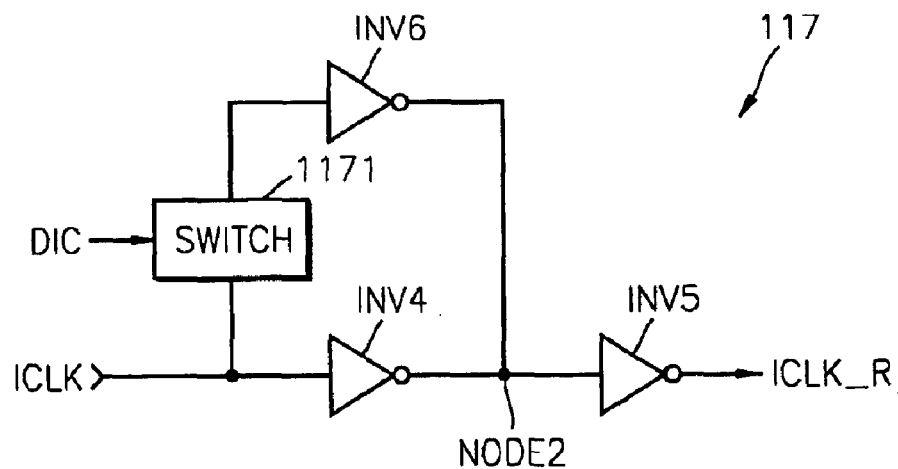
FIG. 3 is a detailed diagram of the replica output driver of FIG. 1.

FIG. 3 is a detailed diagram of a replica output driver of FIG. 1. Referring to FIG. 3, the replica output driver 117 comprises inverters (INV4~INV6) and a switch 1171. That is, the replica output driver 117 has the same elements as those of the driving control unit 131 of FIG. 2 and delays the internal clock signal (ICLK) by an amount that is the same as the delay amount of the driving control unit 131. The inverters (INV4, INV5) buffer the internal clock signal (ICLK) and generate a delayed internal clock signal (ICLK_R). The switch 1171 is turned on/off in response to the control signal (DIC).

If the driver impedance control signal (DIC) is activated and the switch 1171 is turned on, the inverter (INV6) transfers a signal obtained by inverting the internal clock signal (ICLK), to a node (NODE2). The signal transferred to the node (NODE2) increases the driving strength of the buffer formed by the inverters (INV4, INV5).

Meanwhile, though the number of driving strength increment circuits, which increase the driving strength of the buffer formed by the inverter (INV6) and the switch 1711, is one in FIG. 3, other embodiments of the replica output driver 117 may comprise, for example, two, or more, driving strength increment circuits as other embodiments of the driving control unit 131 shown in FIG. 2.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A delay locked loop (DLL) of a semiconductor memory device comprising:
  a replica output driver which has a replica delay amount that is the same as an output delay amount of an output driver coupled thereto, a driving strength of which varies, the replica delay amount of the replica ouput driver varying in response to a driver impedance control signal generated by the semiconductor memory device;
  a phase detector which detects a phase difference between an internal clock signal which is delayed through the replica output driver by the replica delay amount, and an external clock signal;
  a control circuit which generates a delay control signal in response to an output signal of the phase detector; and
  a variable delay circuit which, in response to the delay control signal, delays the external clock signal and generates the internal clock signal in synchronization with the external clock signal.

2. The DLL of claim 1, wherein the driving strength of the output driver varies in response to the driver impedance control signal, and in response to the driver impedance control signal, the replica output driver has the same delay amount as the output delay amount of the internal clock signal generated by the output driver.

3. The DLL of claim 1 wherein the driver impedance control signal is stored in a mode register of the semiconductor memory device.

4. The DLL of claim 1, wherein the replica output driver comprises:
  a first inverter which inverts the internal clock signal;
  a second inverter which inverts the output signal of the first inverter and generates the internal clock signal;
  a third inverter which inverts the internal clock signal; and
  a switch which, in response to the driver impedance control signal, transfers the output signal of the third inverter to a node between an output terminal of the first inverter and an input terminal of the second inverter.

5. A delay locked loop (DLL) of a semiconductor memory device comprising:
  a replica output driver which has a replica delay amount that is the same as an output delay amount of an output driver coupled thereto, the driving strength of which varies;

a phase detector which detects a phase difference between an internal clock signal which is delayed through the replica output driver by the replica delay amount, and an external clock signal;

a control circuit which generates a control signal in response to an output signal of the phase detector; and a variable delay circuit which, in response to the control signal, delays the external clock signal and generates the internal clock signal in synchronization with the external clock signal, wherein the driving strength of the output driver varies in response to a driver impedance control signal generated by the semiconductor memory device, and in response to the driver impedance control signal, the replica output driver has the same delay amount as the delay amount of the internal clock signal generated by the output driver.

6. The DLL of claim 5 wherein the driver impedance control signal is stored in a mode register of the semiconductor memory device.

7. The DLL of claim 5, wherein the replica output driver comprises:

a first inverter which inverts the internal clock signal;

a second inverter which inverts the output signal of the first inverter and generates the internal clock signal;

a third inverter which inverts the internal clock signal; and a switch which, in response to the driver impedance control signal, transfers the output signal of the third inverter to a node between an output terminal of the first inverter and an input terminal of the second inverter.

* * * * *